United States Patent
Yoon et al.

(10) Patent No.: US 8,913,451 B2
(45) Date of Patent: Dec. 16, 2014

(54) MEMORY DEVICE AND TEST METHOD THEREOF

(71) Applicant: SK Hynix Inc., Gyeonggi-do (KR)

(72) Inventors: Hyunsu Yoon, Gyeonggi-do (KR); Yongho Seo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 218 days.

(21) Appl. No.: 13/672,577

(22) Filed: Nov. 8, 2012

(65) Prior Publication Data

US 2014/0126302 A1  May 8, 2014

(51) Int. Cl.
G11C 29/44 (2006.01)
(52) U.S. Cl.
USPC ............... 365/201; 365/189.04; 365/230.03
(58) Field of Classification Search
USPC .................... 365/201, 189.04, 230.03
See application file for complete search history.

(56) References Cited

U.S. PATENT DOCUMENTS

| | | | |
|---|---|---|---|
| 5,996,106 A * | 11/1999 | Seyyedy | 714/763 |
| 6,163,863 A * | 12/2000 | Schicht | 714/718 |
| 6,667,902 B2 | 12/2003 | Peng | |
| 6,777,757 B2 | 8/2004 | Peng et al. | |
| 7,173,851 B1 | 2/2007 | Callahan et al. | |
| 7,269,047 B1 | 9/2007 | Fong et al. | |
| 2014/0126301 A1* | 5/2014 | Yoon et al. | 365/189.04 |

* cited by examiner

Primary Examiner — Huan Hoang
Assistant Examiner — Jay Radke
(74) Attorney, Agent, or Firm — IP & T Group LLP

(57) ABSTRACT

A method for testing a memory device includes entering a test mode in which multiple memory banks operate in a same manner, allowing a row corresponding to a row address in the multiple memory banks to be activated, latching a bank address and the row address corresponding to the multiple memory banks, writing same data in a column selected by a column address in the multiple memory banks, reading the data written in the writing of the data from the multiple memory banks, checking whether the data read from the multiple memory banks in the reading of the data are equal to each other, and programming the row address to locations designated by the bank address latched in the latching in a nonvolatile memory when the data read from the multiple memory banks are different from each other.

18 Claims, 9 Drawing Sheets

MEMORY DEVICE AND TEST METHOD THEREOF

BACKGROUND

1. Field

Exemplary embodiments of the present invention relate to a memory device and a test method thereof.

2. Description of the Related Art

Most memory device such as DRAM (Dynamic Random Access Memory) has a repair scheme for repairing failures therein.

FIG. 1 is a block diagram illustrating a conventional memory device including a row repair scheme.

Referring to FIG. 1, the memory device includes a cell array 110 including a plurality of memory cells, a row circuit 120 for activating a word line selected by a row address R_ADD, and a column circuit for accessing a bit line selected by a column address C_ADD for reading or writing.

A row fuse circuit 140 stores a row address corresponding to a failed memory cell in the cell array 110, as a repair row address REPAIR_R_ADD. A row comparison unit 150 compares the repair row address REPAIR_R_ADD stored in the row fuse circuit 140 with the row address R_ADD input from an external source. When the repair row address REPAIR_R_ADD coincides with the row address R_ADD, the row comparison unit 150 controls the row circuit 120 to activate a redundant word line instead of the word line designated by the row address R_ADD. That is, the word line corresponding to the repair row address REPAIR_R_ADD stored in the row fuse circuit 140 is replaced with the redundant word line.

A signal RACT in FIG. 1 indicates that an active command for allowing a word line to be active, a signal RD indicates a read command, and a signal WT indicates a write command.

The conventional row fuse circuit 140 mainly includes a plurality of laser fuses. A unit laser fuse stores 'high' or 'low' data according to whether the fuse has been cut. Programming of the laser fuse is possible only at a wafer level, that is, it is not possible to program the laser fuse at a package level. Furthermore, it is difficult to design the laser fuse to have a smaller area due to the limitation of a line pitch.

In order to overcome such disadvantages of the laser fuse, a nonvolatile memory, such as an efuse array circuit, a NAND flash memory, a NOR flash memory, an EPROM (Erasable Programmable Read Only Memory), an EEPROM (Electrically Erasable Programmable Read Only Memory), a FRAM (Ferroelectric RAM), or a MRAM (Magnetoresistive RAM), is mounted in a memory device, and repair information is stored in the nonvolatile memory, as disclosed in U.S. Pat. Nos. 6,904,751, 6,777,757, 6,667,902, 7,173,851, and 7,269,047.

FIG. 2 is a block diagram illustrating a memory device in which a nonvolatile memory is used to store repair information.

Referring to FIG. 2, the memory device includes a plurality of memory banks BK0 to BK3, registers 210_0 to 210_3 provided to the memory banks BK0 to BK3 to store repair information, and a nonvolatile memory 201.

The nonvolatile memory 201 is provided instead of the fuse circuit 140. The nonvolatile memory 201 stores repair information (i.e., repair addresses) corresponding to the memory banks BK0 to BK3. The nonvolatile memory may be one of an efuse array circuit, a NAND flash memory, a NOR flash memory, an EPROM, an EEPROM, a FRAM, and a MRAM.

The registers 210_0 to 210_3 are configured to be provided to the corresponding memory banks BK0 to BK3 and store repair information for the corresponding memory banks, respectively. That is, the register 210_0 is configured to store repair information for the memory bank BK0, and the register 210_2 is configured to store repair information for the memory bank BK2. The registers 210_0 to 210_3 include latch circuits, and are configured to store the repair information only when power is supplied thereto. The repair information to be stored in the registers 210_0 to 210_3 is received from the nonvolatile memory 201.

Since the nonvolatile memory 201 is provided in an array type, a certain time is required to call data stored therein. Thus, it may not be possible to directly perform a repair operation using the data stored in the nonvolatile memory 201. In this regard, the repair information stored in the nonvolatile memory 201 is transmitted to and stored in the registers 210_0 to 210_3, and data stored in the registers 210_0 to 210_3 is used for repair operations for the corresponding memory banks BK0 to BK3. The process, in which the repair information stored in the nonvolatile memory 201 is transmitted to the registers 210_0 to 210_3, is called boot-up, and such a boot-up operation is performed in an initialization operation of the memory device.

SUMMARY

Exemplary embodiments of the present invention are directed to a technology for programming a failed address to a nonvolatile memory through a test in a memory device using the nonvolatile memory to store repair information.

In accordance with an embodiment of the present invention, a method for testing a memory device includes entering a test mode in which two or more memory banks operate in a same manner, allowing a row corresponding to a row address in the two or more memory banks to be activated, latching a bank address and the row address corresponding to the two or more memory banks, writing same data in a column selected by a column address in the two or more memory banks, reading the data written in the writing of the data from the two or more memory banks, checking whether the data read from the two or more memory banks in the reading of the data are equal to each other, and programming the row address to locations designated by the bank address latched in the latching in a nonvolatile memory when the data read from the two or more memory banks are different from each other.

In accordance with another embodiment of the present invention, a memory device includes first to $N^{th}$ bank groups (N is an integer equal to or more than 2), each of which including two or more memory banks configured to simultaneously perform an active operation in response to same row address and to simultaneously perform read and write operations in response to same column address when a test mode is set, a bank selection unit configured to select one bank group for performing active, read, and write operations from the first to $N^{th}$ bank groups in response to a bank address when the test mode is set, a latch unit configured to latch the bank address and the row address in the active operation in which the test mode has been set, a fail flag generation unit configured to compare data read from memory banks in the selected bank group when the test mode is set, and to generate a fail flag based on the comparison result, and a nonvolatile memory configured to store the row address latched in the latch unit in a location designated by the bank address latched in the latch unit when the fail flag is activated.

In accordance with yet another embodiment of the present invention, a memory device includes a plurality of memory banks configured to allow a row corresponding to a row address to be activated when bank activation signals corresponding to the plurality of memory banks are activated, and to perform read and write operations for a column corresponding to a column address when bank selection signals corresponding to the plurality of memory banks are activated, a bank selection unit configured to generate the bank selection signals in response to a bank address, and to simultaneously activate two or more bank selection signals when a test mode is set, a bank active control unit configured to generate the bank activation signals in response to an active command and the bank selection signals, a plurality of input/output circuits configured to be provided to the corresponding memory banks, to be activated in response to the corresponding bank selection signal, to transfer write data to the corresponding memory banks in a write operation, and to output read data from the corresponding memory bank in a read operation, a latch unit configured to latch the bank address and the row address when the active command is activated after the test mode is set, a fail flag generation unit configured to compare read data transferred from the input/output circuits corresponding to the activated bank selection signals when the test mode is set, and to generate a fail flag based on the comparison result, and a nonvolatile memory configured to store the row address latched in the latch unit in a location designated by the bank address latched in the latch unit when the fail flag is activated.

In accordance with still another embodiment of the present invention, a memory device includes first to $N^{th}$ bank groups (N is an integer equal to or more than 2), each of which including two or more memory banks configured to allow row corresponding to row address to be active when bank activation signals corresponding to the memory banks are activated, and to perform read and write operations for column corresponding to column address when bank selection signals corresponding to the memory banks are activated, a bank selection unit configured to generate the bank selection signals in response to a bank address, and to activate the plurality of bank selection signals when a test mode is set, a bank active control unit configured to generate the bank activation signals in response to an active command and the bank selection signals, a plurality of input/output circuits configured to be provided to the corresponding memory banks, to be activated in response to the corresponding bank selection signals, to transfer write data to the corresponding memory banks in a write operation, and to output read data from the corresponding memory banks in a read operation, a latch unit configured to latch the row address when the active command is activated after the test mode is set, first to $N^{th}$ fail flag generation units configured to correspond to the first to $N^{th}$ bank groups in a one-to-one manner, compare read data transferred from the input/output circuits corresponding to the memory banks in the corresponding bank groups when the test mode is set, and to generate first to $N^{th}$ fail flags based on the comparison result, and a nonvolatile memory configured to store the row address latched in the latch unit in a location designated by an activated fail flag of the first to $N^{th}$ fail flags.

According to the present invention, it may be possible to easily detect a failed row of each bank, and the detected failed row is directly programmed to a nonvolatile memory, and thus, it may be possible to shorten a test time for repairing a failed memory cell.

DETAILED DESCRIPTION

Figure 1:
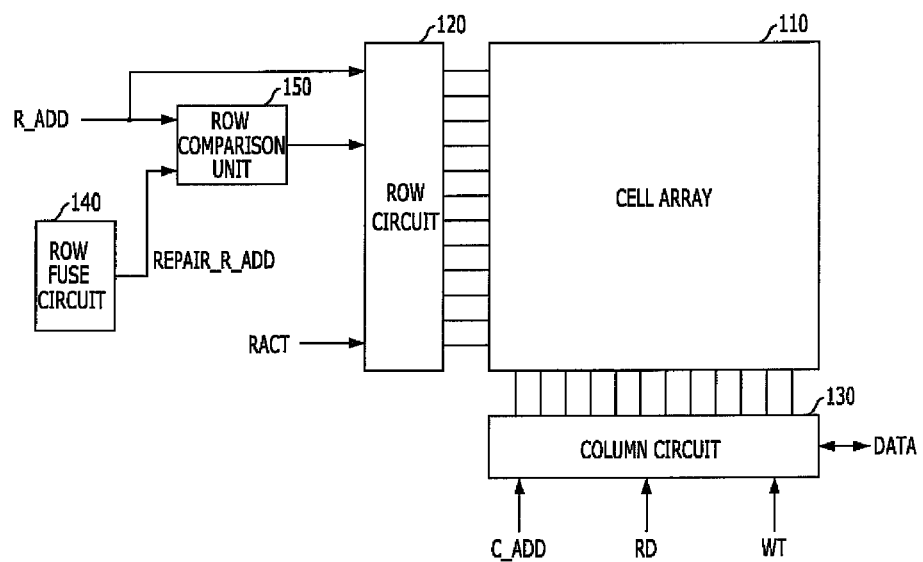
FIG. 1 is a block diagram illustrating a conventional memory device including a row repair scheme.
Figure 2:
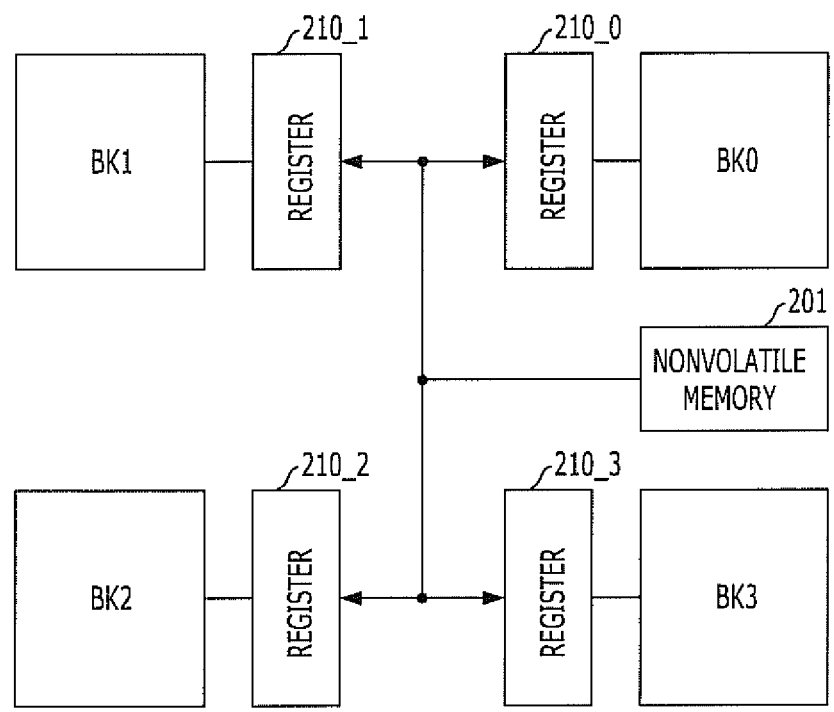
FIG. 2 is a block diagram illustrating a memory device in which a nonvolatile memory is used to store repair information.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
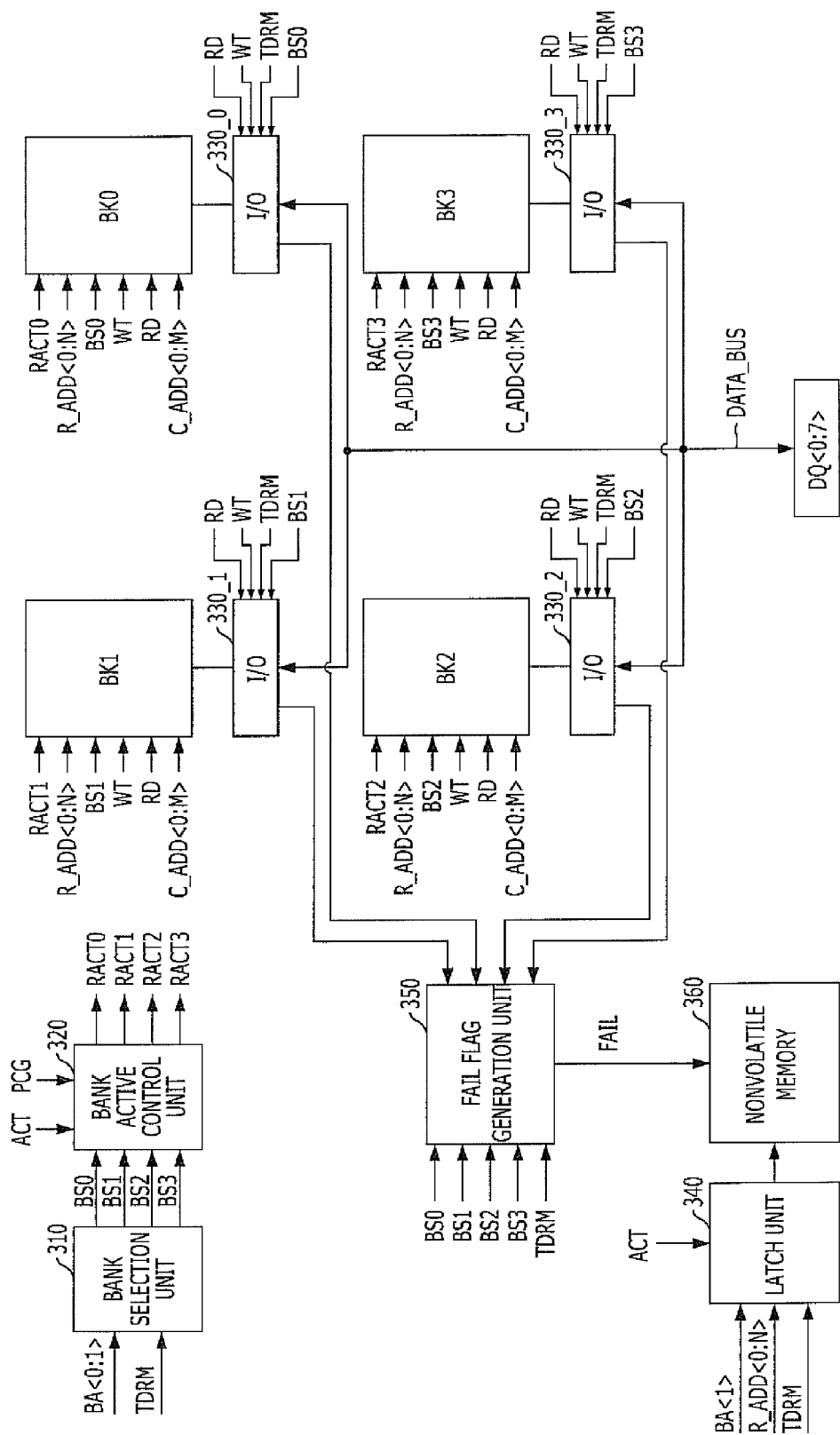
FIG. 3 is a block diagram of a memory device in accordance with an embodiment of the present invention.

FIG. 3 is a block diagram of a memory device in accordance with an embodiment of the present invention.

Referring to FIG. 3, the memory device includes a plurality of memory banks BK0 to BK3, a bank selection unit 310, a bank active control unit 320, a plurality of input/output circuits 330_0 to 330_3, a latch unit 340, a fail flag generation unit 350, a nonvolatile memory 360, and a plurality of input/output pads DQ<0:7>.

The plurality of memory banks BK0 to BK3 are configured to allow a word line corresponding to row address R_ADD<0:N> to be activated when corresponding bank activation signals RACT0 to RACT3 is activated, to allow data to be written in a bit line corresponding to column address C_ADD<0:M> in response to a write command WT when corresponding bank selection signals BS0 to BS3 is activated, and to allow data to be read from a bit line corresponding to a column address C_ADD<0:M> in response to a read command RD when the corresponding bank selection signals BS0 to BS3 is activated. For example, the memory bank BK1 allows the word line selected by the row address R_ADD<0:N> to be activated when the bank activation signal RACT1 is activated, and allows data to be written in the bit line selected by the column address C_ADD<0:M> in response to the write command WT or allows data to be read from the bit line selected by the column address C_ADD<0:M> in response to the read command RD when the corresponding bank selection signal BS1 is activated.

The bank selection unit 310 is configured to generate the plurality of bank selection signals BS0 to BS3 in response to bank address BA<0:1>. When a test mode signal TDRM is deactivated, that is, during a normal operation, the bank selection unit 310 decodes all bits of the bank address BA<0:1> and activates one of the bank selection signals BS0 to BS3.

However, when the test mode signal TDRM is activated, the bank selection unit 310 decodes a partial bit BA<1> of the bank address BA<0:1> and activates two bank selection signals at a time. The test mode signal TDRM is activated during a test mode in which two or more memory banks simultaneously operate in order to find a failed row. Referring to Table 1 below, it is possible to recognize an operation of the bank selection unit 310 when the test mode signal TDRM is activated (TDRM=1) and is deactivated (TDRM=0).

TABLE 1

| TDRM | BA<1> | BA<0> | Activated bank selection signal |
|---|---|---|---|
| 0 | 0 | 0 | BS0 |
| 0 | 0 | 1 | BS1 |
| 0 | 1 | 0 | BS2 |
| 0 | 1 | 1 | BS3 |
| 1 | 0 | don't care | BS0, BS1 |
| 1 | 1 | don't care | BS2, BS3 |

The bank active control unit 320 is configured to generate the bank activation signals RACT0 to RACT3, corresponding to each of the memory banks BK0 to BK3, using an active command ACT and the bank selection signals BS0 to BS3. When the active command ACT is activated, the bank active control unit 320 activates a bank activation signal corresponding to an activated signal among the bank selection signals BS0 to BS3. When a precharge command PCG is activated, the bank active control unit 320 deactivates the bank activation signal corresponding to the activated signal among the bank selection signals BS0 to BS3. For example, when the bank selection signal BS2 and the active command ACT are activated, the bank active control unit 320 activates the bank activation signal RACT2. Meanwhile, when the bank selection signal BS2 and the precharge command PCG are activated, the bank active control unit 320 deactivates the bank activation signal RACT2. When the bank activation signals RACT0 to RACT3 are activated once, the bank activation signals RACT0 to RACT3 maintain the activated state until the bank activation signals RACT0 to RACT3 are deactivated by the precharge command PCG.

The latch unit 340 is configured to latch the bank address BA<1> and the row address R_ADD<0:N> when the active command ACT and the test mode signal TDRM are activated. At the time of the activation of the test mode signal TDRM, since the other one BA<0> of the bank address BA<0:1> is in "don't care" state, the latch unit 340 latches only the BA<1>. That is, the latch unit 340 latches the bank address BA<1> and the row address R_ADD<0:N> in an active operation.

The plurality of input/output pads DQ<0:7> are pads through which data is input from an external source, or data is externally output from the memory device. A data bus DATA_BUS is used to transmit data to be input or output through the plurality of input/output pads DQ<0:7>. In the present embodiment, it is assumed that the number of the input/output pads DQ<0:7> is 8.

The plurality of input/output circuits 330_0 to 330_3 are provided to the memory banks BK0 to BK3, respectively. The plurality of input/output circuits 330_0 to 330_3 are activated when the bank selection signals BS0 to BS3 corresponding to the input/output circuits 330_0 to 330_3 are activated. The plurality of input/output circuits 330_0 to 330_3 receive the test mode signal TDRM. In a first case in which the test mode signal TDRM has been deactivated, when the write command WT is activated, the plurality of input/output circuits 330_0 to 330_3 transfer data received from the data bus DATA_BUS to memory banks corresponding to the input/output circuits 330_0 to 330_3. When the read command RD is activated, the plurality of input/output circuits 330_0 to 330_3 transfer data output from the memory banks corresponding to the input/output circuits 330_0 to 330_3 to the data bus DATA BUS. In a second case in which the test mode signal TDRM has been activated, when the write command WT is activated, the plurality of input/output circuits 330_0 to 330_3 transfer data received from the data bus DATA BUS to the memory banks corresponding to the input/output circuits 330_0 to 330_3. When the read command RD is activated, the plurality of input/output circuits 330_0 to 330_3 transfer data output from the memory banks corresponding to the input/output circuits 330_0 to 330_3 to the fail flag generation unit 350.

The fail flag generation unit 350 is configured to compare read data transferred from the input/output circuits 330_0 to 330_3 corresponding to the activated bank selection signals of the bank selection signals BS0 to BS3 when the test mode is set, and to generate a fail flag FAIL based on the comparison result. When read data transferred from the input/output circuits different from one another are equal to each other, the fail flag generation unit 350 deactivates the fail flag FAIL. Otherwise, the fail flag generation unit 350 activates the fail flag FAIL. For example, in a case in which the test mode signal TDRM has been activated and the bank selection signals BS0 and BS1 have been activated, when the read command RD is activated, read data are transferred from the input/output circuits 330_0 and 330_1. When the read data transferred from the input/output circuit 330_0 is equal to the read data transferred from the input/output circuit 330_1, the fail flag generation unit 350 deactivates the fail flag FAIL. When the read data transferred from the input/output circuit 330_0 is different from the read data transferred from the input/output circuit 330_1, the fail flag generation unit 350 activates the fail flag FAIL.

When the fail flag FAIL is activated, the nonvolatile memory 360 matches the bank address and the row address stored in the latch unit 340 with each other, and stores them. That is, when the fail flag FAIL is activated, the bank address and the row address are programmed to the nonvolatile memory. The matched bank address and row address stored in the nonvolatile memory 360 are used for the repair operation of the memory device. The nonvolatile memory 360 may be one of an efuse array circuit, a NAND flash memory, a NOR flash memory, an EPROM, an EEPROM, a FRAM, and a MRAM.

Figure 4:
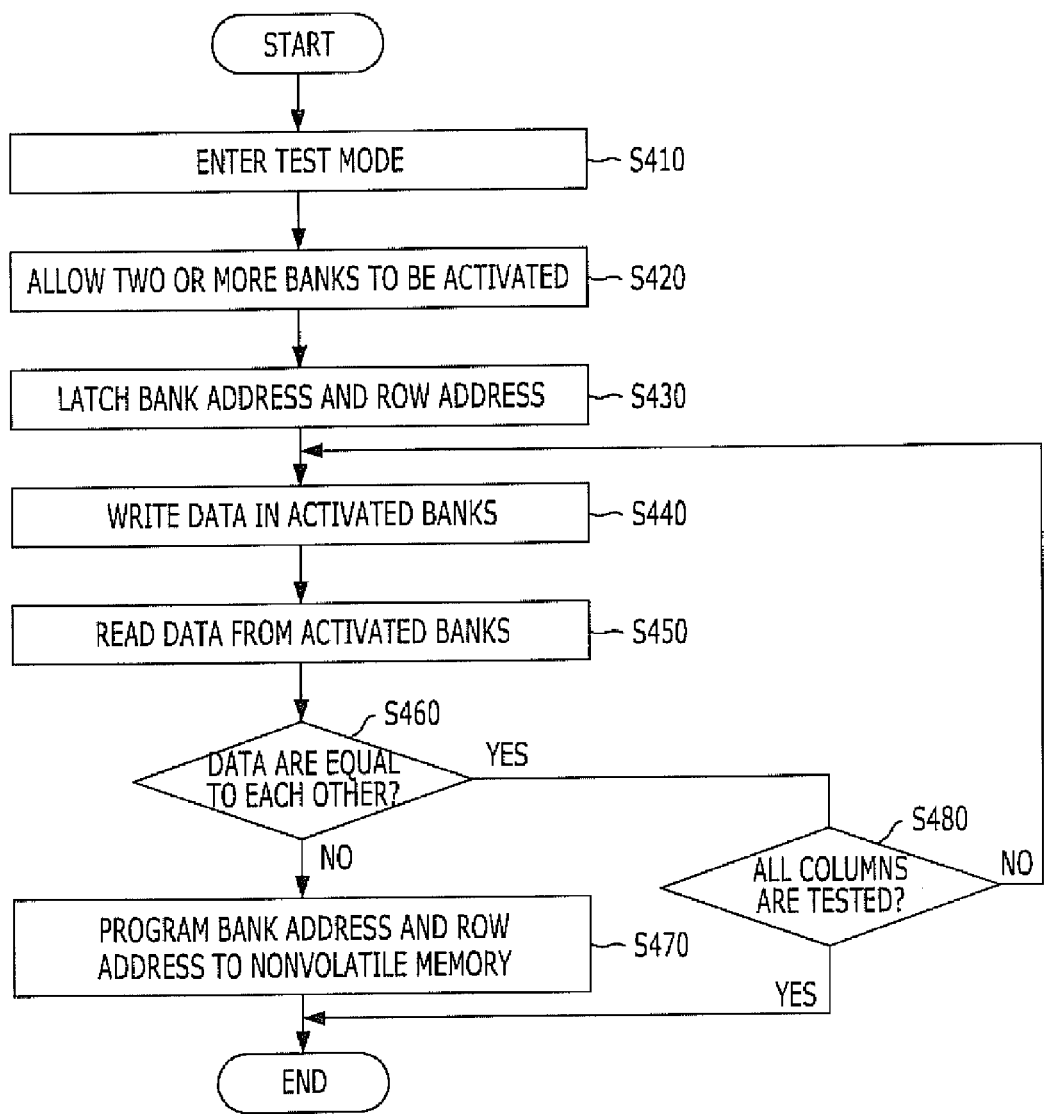
FIG. 4 is a flowchart illustrating a method for testing the memory device shown in FIG. 3.

FIG. 4 is a flowchart illustrating a method for testing the memory device shown in FIG. 3.

Referring to FIG. 4, the test mode signal TDRM is activated, so that a test mode is set (S410). The test mode signal TDRM may be activated by applying a setting-related control signal, such as a mode register set (MRS) command, to the memory device. In the test mode in which the test mode signal TDRM has been activated, two or more memory banks simultaneously operate like one. For example, the memory banks BK0 and BK1 simultaneously operate like one and the memory banks BK2 and BK3 simultaneously operate like one. The memory banks BK0 and BK1 may be grouped into a first bank group, and the memory banks BK2 and BK3 may be grouped into a second bank group.

In two or more memory banks, the word lines corresponding to the row address R_ADD<0:N> are activated (S420). When the active command ACT is activated, if the bank address BA<1> is '0', the word lines corresponding to the row address R_ADD<0:N> in the memory banks BK0 and BK1 are activated. Meanwhile, if the bank address BA<1> is '1', the word lines corresponding to the row address R_ADD<0:

N> in the memory banks BK2 and BK3 are activated. For example, when the active command ACT is activated, if the bank address BA<1> is '0' and the row address R_ADD<0:N> indicate $230^{th}$ word line, the $230^{th}$ word line in the memory banks BK0 and BK1 are active. Hereinafter, it is assumed that the $230^{th}$ word lines in the memory banks BK0 and BK1 have been activated.

The bank address BA<1> and the row address R_ADD<0:N> corresponding to the active memory banks BK0 and BK1 are latched (S430). Since the $230^{th}$ word lines in the memory banks BK0 and BK1 have been activated, the bank address BA<1> is latched to '0' and the row address RADD<0:N> are latched to values corresponding to the $230^{th}$ word line. Steps S420 and S430 are performed in response to the activation of the active command ACT. Steps S420 and S430 may be simultaneously performed, or step S430 may be performed before step S420.

Then, the same data is written in the activated memory banks BK0 and BK1 (S440). In a state in which the bank address BA<1> has been applied to '0', when the write command WT is activated, data is written in the bit lines corresponding to the column address C_ADD<0:M> in the memory banks BK0 and BK1. As a consequence, the same data is written in the same location in the memory banks BK0 and BK1.

Then, the data written in the memory banks BK0 and BK1 in step S440 are read therefrom (S450). Similar to step S440, step S450 may be performed by activating the read command RD in a state in which the bank address BA<1> and the column address C_ADD<0:M> have been applied. As a consequence, in step S450, the data written in the memory banks BK0 and BK1 in step S440 are read as is.

Then, it is checked whether the data read from the memory banks BK0 and BK1 in step S450 are equal to each other (S460). When the data read from the memory bank BK0 is equal to the data read from the memory bank BK1, the fail flag generation unit 350 deactivates the fail flag FAIL. In this case, it may be possible to assume that there is no error in the $230^{th}$ word line of the memory bank BK0 and the $230^{th}$ word line of the memory bank BK1. When the data read from the memory bank BK0 is different from the data read from the memory bank BK1, the fail flag generation unit 350 activates the fail flag FAIL. In this case, it may be possible to assume that there is an error in the $230^{th}$ word line of the memory bank BK0 and the $230^{th}$ word line of the memory bank BK1.

When the fail flag FAIL is activated in step S460, the bank address BA<1> and the row address R_ADD<0:N> latched in step S430 are matched with each other, and are programmed to the nonvolatile memory 360 (S470). When the fail flag FAIL is deactivated in step S460, the test operation is completed (if all columns are tested), or steps S440, S450, S460, and S470 may be performed repeatedly while changing the column address C_ADD<0:M>, until the test operation to the $230^{th}$ word line is completed.

Alternatively, steps S420, S430, S440, S450, S460, and S470 of FIG. 4 may be performed repeatedly while changing the row address R_ADD<0:N> and/or the bank address BA<1>.

Through the test method illustrated in FIG. 4, a failed row in the memory device may be quickly found, and when the failed row is found, the failed row may be directly programmed to the nonvolatile memory 360, so that the memory device is repaired.

Figure 5:
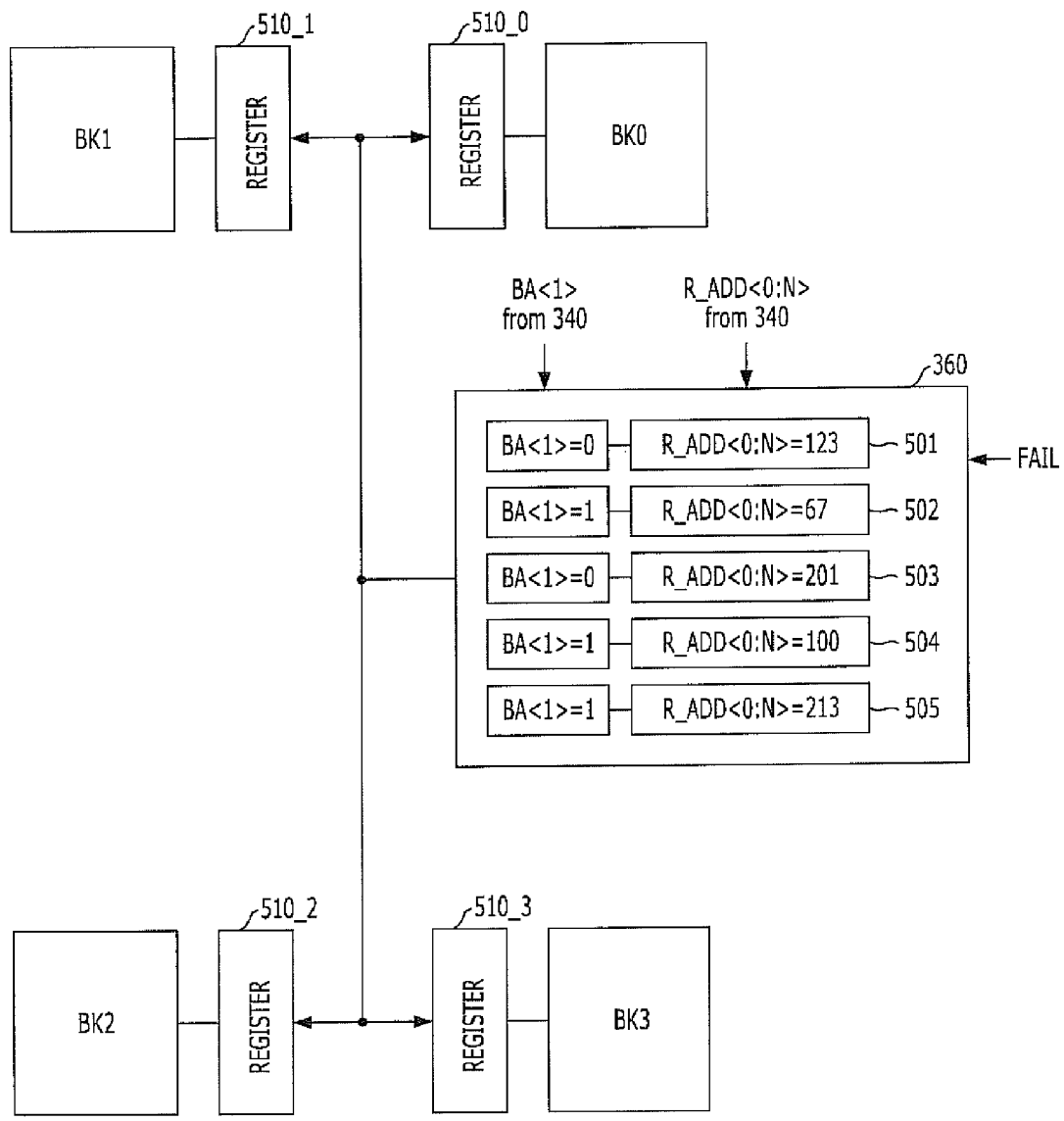
FIG. 5 is a diagram illustrating a process in which a bank address and a row address stored in the nonvolatile memory in match with each other through the process shown in FIG. 4 are used for a repair operation of a memory device.

FIG. 5 is a diagram for explaining a process in which the bank address and the row address stored in the nonvolatile memory 360 in match with each other through the process shown in FIG. 4 are used for the repair operation of the memory device.

Referring to FIG. 5, the bank address BA<1> and the row address R_ADD<0:N> are matched with each other, and are stored in the nonvolatile memory 360. Among them, row address 501 and 503 stored in match with the bank address BA<1> having a value of '0' are transferred to and stored in registers 510_0 and 510_1. Row address 502, 504, and 505 stored in match with the bank address BA<1> having a value of '1' are transferred to and stored in registers 510_2 and 510_3. That is, the bank address BA<1> stored in the nonvolatile memory 360 designates the registers 510_0 to 510_3 to which the matched and stored row address 501 to 505 are to be transferred.

The row address 501 and 503 are received and stored in the registers 510_0 and 510_1, and are used for repairing the row of the memory banks BK0 and BK1. Thus, in the memory banks BK0 and BK1, a $123^{th}$ word line and a $201^{th}$ word line are replaced with redundant word line, respectively. Similarly, since the registers 510_2 and 510_3 receive and store the row address 502, 504, and 505, a $67^{th}$ word line, a $100^{th}$ word line, and a $213^{th}$ word line are replaced with redundant word line in the memory banks BK2 and BK3.

Figure 6:
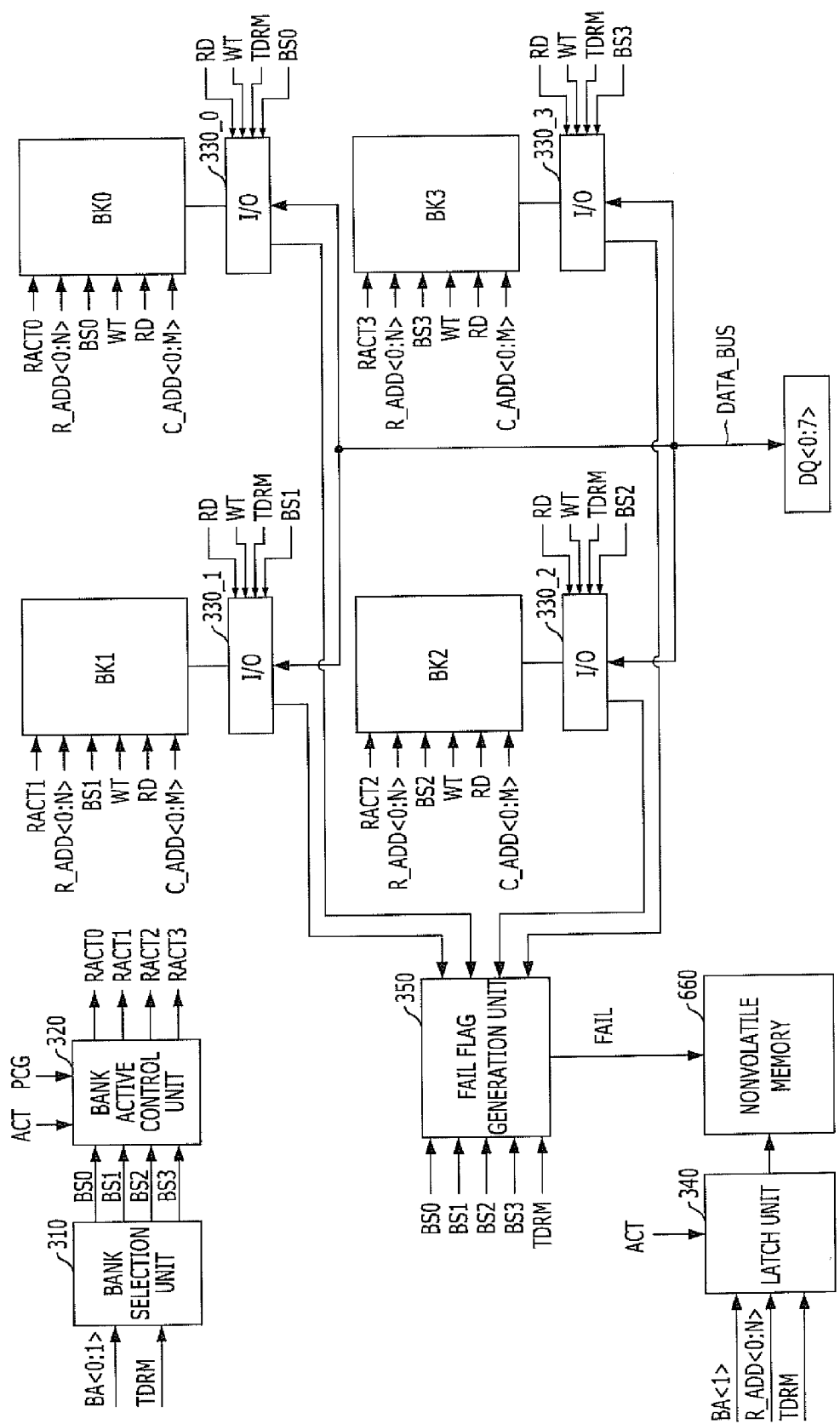
FIG. 6 is a block diagram of a memory device in accordance with another embodiment of the present invention.

FIG. 6 is a block diagram of a memory device in accordance with another embodiment of the present invention.

Referring to FIG. 6, the memory device includes a plurality of memory banks BK0 to BK3, a bank selection unit 310, a bank active control unit 320, a plurality of input/output circuits 330_0 to 330_3, a latch unit 340, a fail flag generation unit 350, a nonvolatile memory 660, and a plurality of input/output pads DQ<0:7>. In the present embodiment, a row address storage scheme of the nonvolatile memory 660 is different from the embodiment of FIG. 3. In FIG. 6, the same reference numerals are used to designate the same elements of the embodiment of FIG. 3.

In the embodiment of FIG. 3, when the fail flag FAIL is activated, the nonvolatile memory 360 matches the bank address and the row address stored in the latch unit 340 with each other and programs the addresses. However, in the embodiment of FIG. 6, when the fail flag FAIL is activated, the nonvolatile memory 660 programs only the row address latched in the latch unit 340. A row address storage location in the nonvolatile memory 660 is determined by the bank address latched in the latch unit 340.

Figure 7:
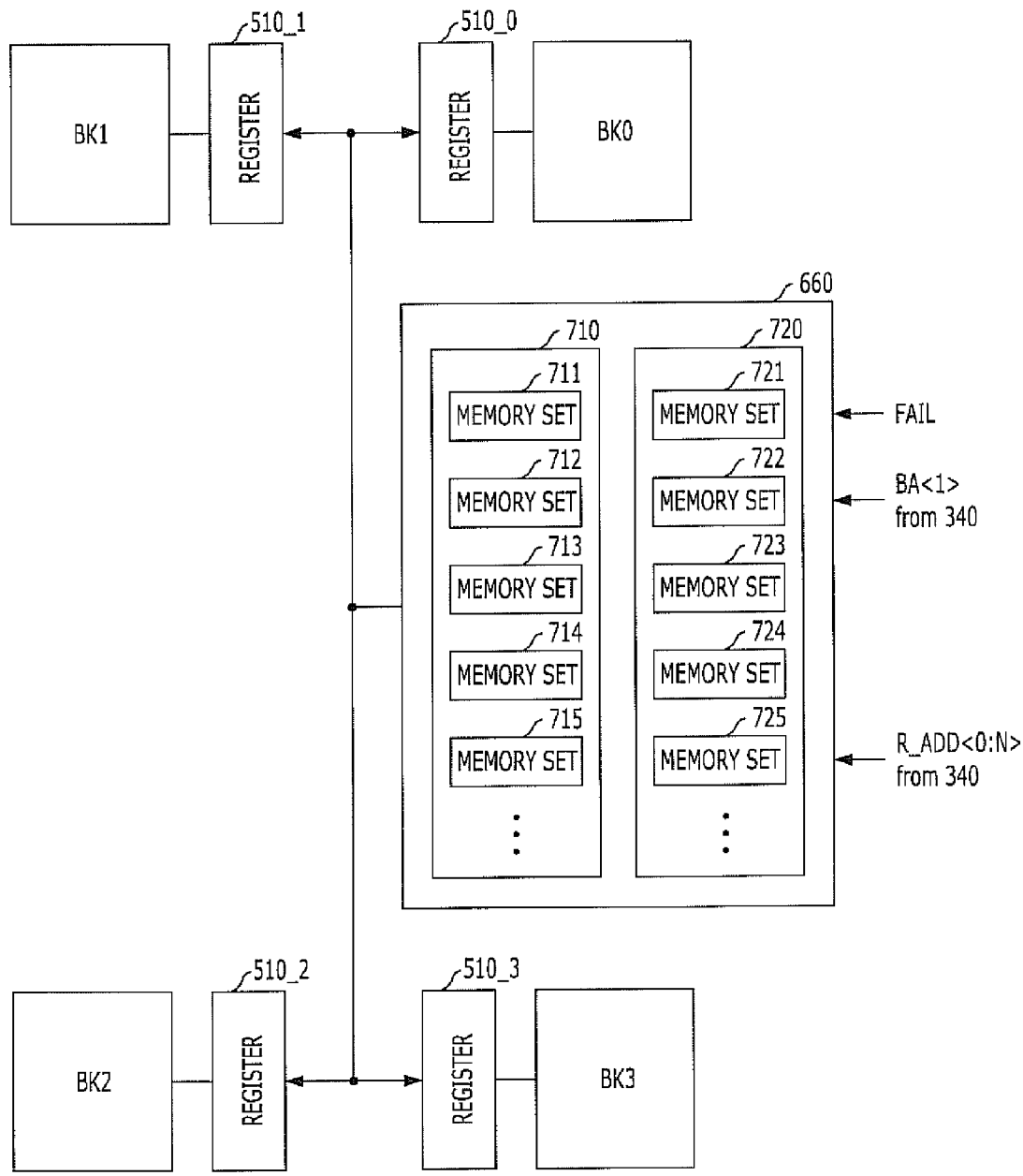
FIG. 7 is a diagram illustrating a process in which a row address is programmed to the nonvolatile memory shown in FIG. 6 and the row address stored in the nonvolatile memory is used for a repair operation of a memory device.

FIG. 7 is a diagram for explaining a process in which the row address is programmed to the nonvolatile memory 660 shown in FIG. 6 and the row address stored in the nonvolatile memory 660 is used for a repair operation of the memory device.

Referring to FIG. 7, the nonvolatile memory 660 includes storages 710 and 720 including a plurality of memory sets 711 to 715 and 721 to 725. The memory sets 711 to 715 and 721 to 725 are configured to store data corresponding to a bit number (N+1 bits) of the row address R_ADD<0:N>, respectively. When the fail flag FAIL is activated, if the bank address BA<1> latched in the latch unit 340 is '0' (that is, corresponds to the bank group including the memory banks BK0 and BK1), the row address R_ADD<0:N> latched in the latch unit 340 are stored in one of the memory sets 711 to 715 in the storage 710 of the nonvolatile memory 660. Meanwhile, when the fail flag FAIL is activated, if the bank address BA<1> latched in the latch unit 340 is '1' (that is, corresponds to the bank group including the memory banks BK2 and BK3), the row address R_ADD<0:N> latched in the latch unit 340 are stored in one of the memory sets 721 to 725 in the storage 720 of the nonvolatile memory 660.

The memory sets 711 to 715 in the storage 710 may have priorities. When the fail flag FAIL is first activated in the state in which the bank address BA<1> has a value of '0', the row address R_ADD<0:N> are stored in the memory set 711. Then, when the fail flag FAIL is activated again in the state in which the bank address BA<1> has a value of '0', the row address R_ADD<0:N> are stored in the memory set 712. Similarly, the memory sets 721 to 725 in the storage 720 may have priorities.

The storages 710 and 720 correspond to the bank groups in a one-to-one manner. The storage 710 corresponds to a first bank group including the memory banks BK0 and BK1, and the storage 720 corresponds to a second bank group including the memory banks BK2 and BK3. The row address stored in the memory sets 711 to 715 and 721 to 725 in the storages 710 and 720 are used for repair operations of the corresponding bank groups. That is, the row address stored in the memory sets 711 to 715 are transmitted to the registers 510_0 to 510_1 and are used for the repair operation, and the row address stored in the memory sets 721 to 725 are transmitted to the registers 510_2 to 510_3 and are used for the repair operation.

In accordance with the embodiment described in FIG. 6 and FIG. 7, the bank address BA<1> is not stored in (programmed to) the nonvolatile memory 660, but the internal areas 710 and 720 of the nonvolatile memory 660 are divided to correspond to the bank groups and the row address R_ADD<0:N> are stored in corresponding areas, so that the repair operation is performed according to the bank group.

Figure 8:
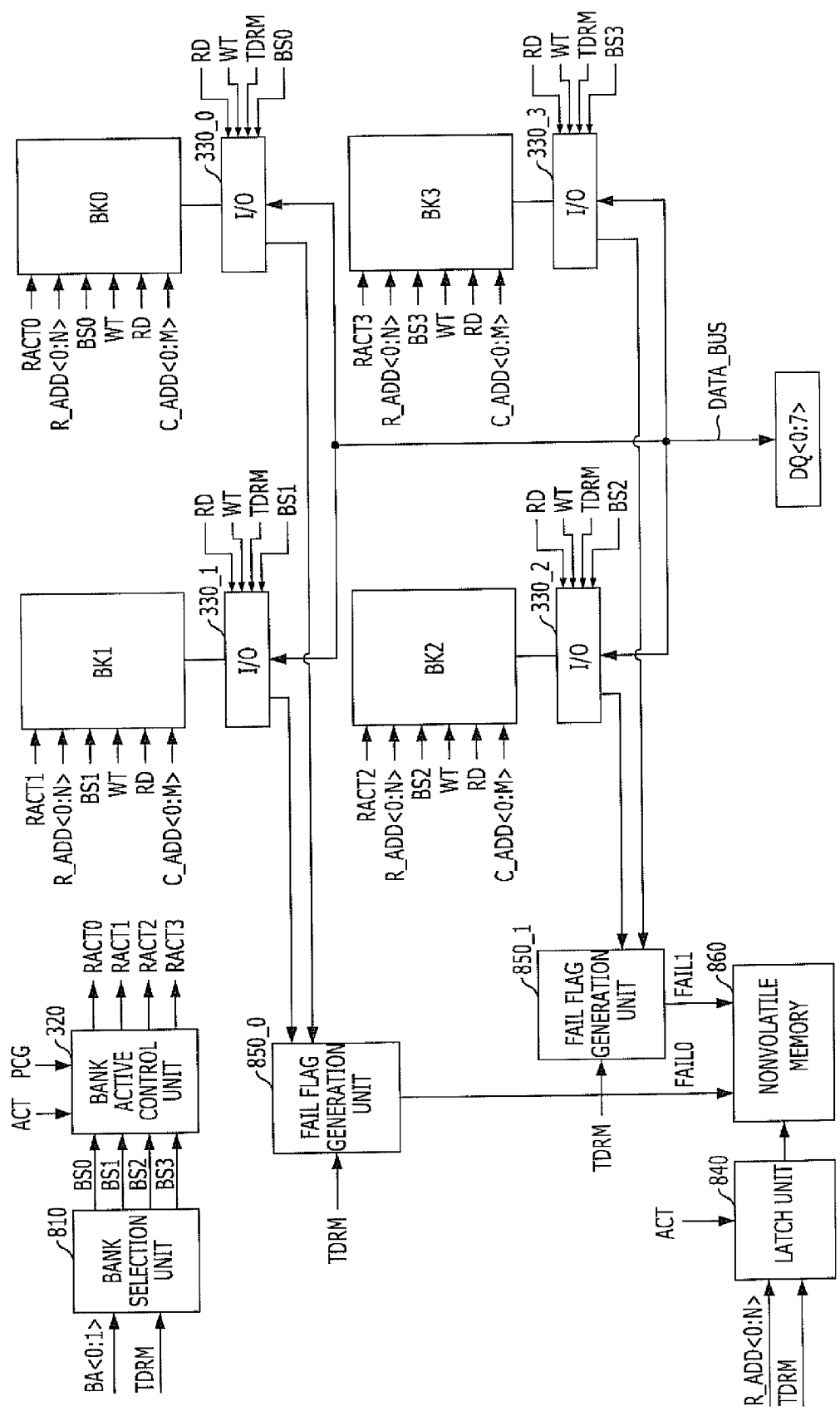
FIG. 8 is a block diagram of a memory device in accordance with yet another embodiment of the present invention.

FIG. 8 is a block diagram of a memory device in accordance with yet another embodiment of the present invention.

Referring to FIG. 8, the memory includes a plurality of memory banks BK0 to BK3, a bank selection unit 810, a bank active control unit 820, a plurality of input/output circuits 330_0 to 330_3, a latch unit 840, fail flag generation units 850_0 and 850_1, a nonvolatile memory 860, and a plurality of input/output pads DQ<0:7>. In FIG. 8, a description will be provided for an embodiment in which all memory banks BK0 to BK3 simultaneously operate in the test mode. In the embodiment of FIG. 8, the same reference numerals are used to designate the same elements of the embodiment of FIG. 3.

When the test mode signal TDRM is deactivated (that is, in the normal operation), the bank selection unit 810 decodes the bank address BA<0:1> and activates one of the bank selection signals BS0 to BS3. However, when the test mode signal TDRM is activated, the bank selection unit 810 activates all the bank selection signals BS0 to BS3. Referring to Table 2 below, it may be possible to recognize an operation of the bank selection unit 810 when the test mode signal TDRM is activated (TDRM=1) and is deactivated (TDRM=0).

TABLE 2

| TDRM | BA<1> | BA<0> | Activated bank selection signal |
|---|---|---|---|
| 0 | 0 | 0 | BS0 |
| 0 | 0 | 1 | BS1 |
| 0 | 1 | 0 | BS2 |
| 0 | 1 | 1 | BS3 |
| 1 | don't care | don't care | BS0, BS1, BS2, BS3 |

In the test mode, since the bank selection unit 810 activates all the bank selection signals BS0 to BS3, all memory banks BK0 to BK3 operate like one in the same manner.

The latch unit 840 is configured to latch the row address R_ADD<0:N> when the active command ACT is activated at the time of activation of the test mode signal TDRM. In the embodiment of FIG. 3, the latch unit 340 latches both the bank address BA<0:1> and the row address R_ADD<0:N>. However, the latch unit 840 of the present embodiment latches only the row address R_ADD<0:N>.

In FIG. 8, the fail flag generation units 850_0 and 850_1 are provided to the bank groups, respectively. The fail flag generation unit 850_0 is provided to the bank group including the memory banks BK0 and BK1, and the fail flag generation unit 850_1 is provided to the bank group including the memory banks BK2 and BK3. At the time of activation of the test mode signal TDRM, the fail flag generation unit 850_0 compares read data of the memory bank BK0 transferred from the input/output circuit 330_0 with read data of the memory bank BK1 transferred from the input/output circuit 330_1, deactivates a fail flag FAIL0 when the read data of the memory bank BK0 is equal to the read data of the memory bank BK1, and activates the fail flag FAIL0 when the read data of the memory bank BK0 is different from the read data of the memory bank BK1. Similarly, at the time of activation of the test mode signal TDRM, the fail flag generation unit 850_1 compares read data of the memory bank BK2 transferred from the input/output circuit 330_2 with read data of the memory bank BK3 transferred from the input/output circuit 330_3, deactivates a fail flag FAIL1 when the read data of the memory bank BK2 is equal to the read data of the memory bank BK3, and activates the fail flag FAIL1 when the read data of the memory bank BK2 is different from the read data of the memory bank BK3.

The nonvolatile memory 860 is configured to store the row address R_ADD<0:N> latched in the latch unit 840 when the fail flags FAIL0 and FAIL1 are activated. Locations for storing the row address R_ADD<0:N> in the nonvolatile memory 860 are determined by the fail flags FAIL0 and FAIL1.

In accordance with the embodiment shown in FIG. 8, it may be possible to detect and store failed row address while simultaneously testing all the memory banks BK0 to BK3, which may significantly shorten a test time.

Figure 9:
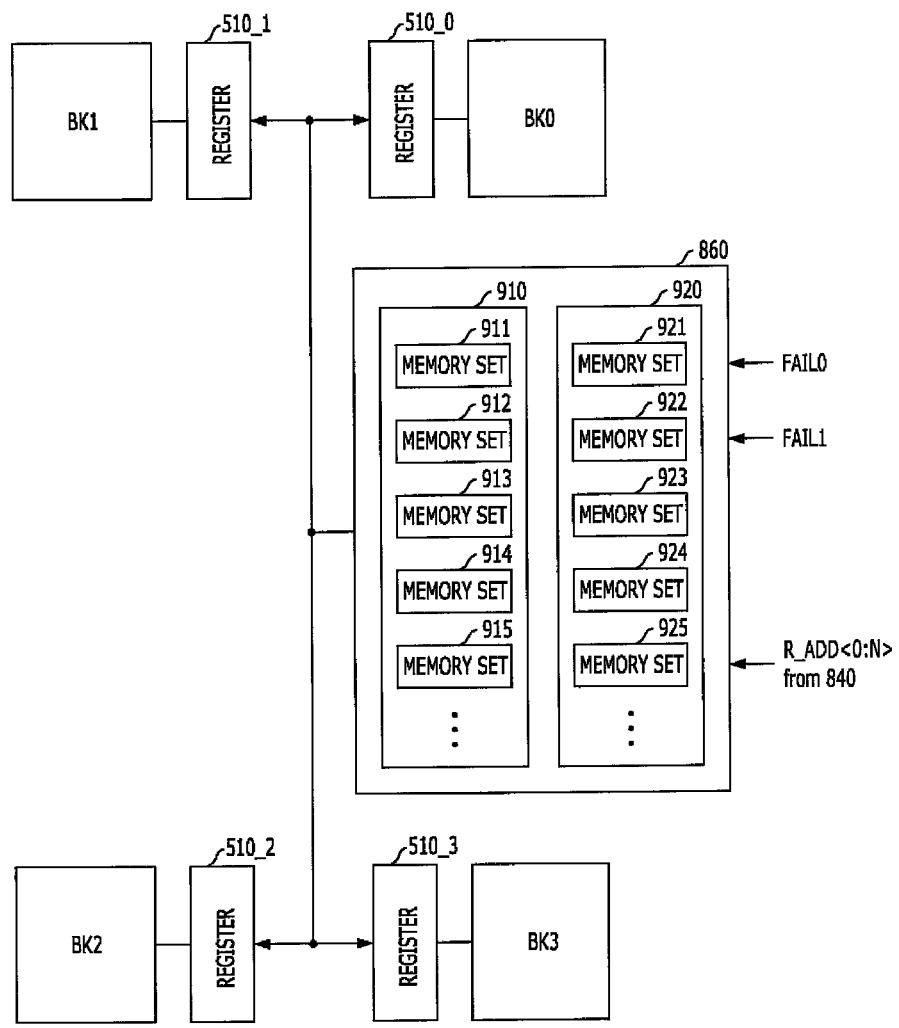
FIG. 9 is a diagram illustrating a process in which a row address is programmed to the nonvolatile memory shown in FIG. 8 and the row address stored in the nonvolatile memory is used for a repair operation of a memory device.

FIG. 9 is a diagram for explaining a process in which the row address is programmed to the nonvolatile memory 860 of FIG. 8 and the row address stored in the nonvolatile memory 860 is used for a repair operation of the memory device.

Referring to FIG. 9, the nonvolatile memory 860 includes storages 910 and 920 including a plurality of memory sets 911 to 915 and 921 to 925. The memory sets 911 to 915 and 921 to 925 are configured to store data corresponding to a bit number (N+1 bits) of the row address R_ADD<0:N>, respectively. When the fail flag FAIL0 is activated, the row address R_ADD<0:N> latched in the latch unit 840 are stored in one of the memory sets 911 to 915 in the storage 910 of the nonvolatile memory 860. Meanwhile, when the fail flag FAIL1 is activated, the row address R_ADD<0:N> latched in the latch unit 840 are stored in one of the memory sets 921 to 925 in the storage 920 of the nonvolatile memory 860. When the fail flag FAIL0 and the fail flag FAIL1 are simultaneously activated, the same row address R_ADD<0:N> are stored in one of the memory sets 911 to 915 in the storage 910 and one of the memory sets 921 to 925 in the storage 920.

The memory sets 911 to 915 and 921 to 925 in the storages 910 and 920 may have priorities. When the fail flag FAIL0 is primarily activated, the row address R_ADD<0:N> are stored in the memory set 911. Then, when the fail flag FAIL0 is secondarily activated, the row address R_ADD<0:N> are stored in the memory set 912. Similarly, when the fail flag FAIL1 is primarily activated, the row address R_ADD<0:N> are stored in the memory set 921. Then, when the fail flag FAIL1 is secondarily activated, the row address R_ADD<0:N> are stored in the memory set 922.

The storages 910 and 920 correspond to the bank groups in a one-to-one manner. The storage 910 corresponds to the bank group including the memory banks BK0 and BK1, and the storage 920 corresponds to the bank group including the memory banks BK2 and BK3. The row address stored in the memory sets 911 to 915 and 921 to 925 in the storages 910 and 920 are used for repair operations of corresponding to bank groups. That is, the row address stored in the memory sets 911 to 915 are transmitted to the registers 510_0 to 510_1 and are used for the repair operation, and the row address stored in the memory sets 921 to 925 are transmitted to the registers 510_2 to 510_3 and are used for the repair operation.

In accordance with the embodiment described in FIG. 8 and FIG. 9, the separate fail flags FAIL0 and FAIL1 are generated for the bank groups, respectively. Furthermore, the bank address BA<1> is not stored in (programmed to) the nonvolatile memory, but the internal spaces of storages 910 and 920 of the nonvolatile memory 860 are divided to correspond to the bank groups and the row address R_ADD<0:N> that are stored according to corresponding fail flags FAIL0 and FAIL1, so that the repair operation is performed according to the bank group.

While the present invention has been described with respect to the specific embodiments, it will be apparent to those skilled in the art that various changes and modifications may be made without departing from the spirit and scope of the invention as defined in the following claims.

What is claimed is:

1. A method for testing a memory device, comprising:
   entering a test mode in which two or more memory banks operate in a same manner;
   allowing a row corresponding to a row address in the two or more memory banks to be activated;
   latching a bank address and the row address corresponding to the two or more memory banks;
   writing same data in a column selected by a column address in the two or more memory banks;
   reading the data written in the writing of the data from the two or more memory banks;
   checking whether the data read from the two or more memory banks in the reading of the data are equal to each other; and
   programming the row address to locations designated by the bank address latched in the latching in a nonvolatile memory when the data read from the two or more memory banks are different from each other.

2. The method of claim 1, wherein the writing of the data, the reading of the data, the checking of the data, and the programming of the row address are performed in multiple times while changing the column address.

3. A memory device comprising:
   first to $N^{th}$ bank groups (N is an integer equal to or more than 2), each of which including two or more memory banks configured to simultaneously perform an active operation in response to same row address and to simultaneously perform read and write operations in response to same column address when a test mode is set;
   a bank selection unit configured to select one bank group for performing active, read, and write operations from the first to $N^{th}$ bank groups in response to a bank address when the test mode is set;
   a latch unit configured to latch the bank address and the row address in the active operation in which the test mode has been set;
   a fail flag generation unit configured to compare data read from memory banks in the selected bank group when the test mode is set, and to generate a fail flag based on the comparison result; and
   a nonvolatile memory configured to store the row address latched in the latch unit in a location designated by the bank address latched in the latch unit when the fail flag is activated.

4. The memory device of claim 3, wherein the nonvolatile memory comprises first to $N^{th}$ storages including a plurality of memory sets for storing row address, and wherein the first to $N^{th}$ storages correspond to the first to $N^{th}$ bank groups, respectively.

5. The memory device of claim 4, wherein information stored in the first to $N^{th}$ storages are used for repair operations of corresponding bank groups.

6. The memory device of claim 3, wherein the fail flag generation unit is configured to deactivate the fail flag when the data read from the memory banks in the selected bank group are equal to each other, and to activate the fail flag when the data read from the memory banks in the selected bank group are different from each other.

7. The memory device of claim 3, wherein the memory banks in the first to $N^{th}$ bank groups are configured to independently operate in a normal operation.

8. A memory device comprising:
   a plurality of memory banks configured to allow a row corresponding to a row address to be activated when bank activation signals corresponding to the plurality of memory banks are activated, and to perform read and write operations for a column corresponding to a column address when bank selection signals corresponding to the plurality of memory banks are activated;
   a bank selection unit configured to generate the bank selection signals in response to a bank address, and to simultaneously activate two or more bank selection signals when a test mode is set;
   a bank active control unit configured to generate the bank activation signals in response to an active command and the bank selection signals;
   a plurality of input/output circuits configured to be provided to the corresponding memory banks, to be activated in response to the corresponding bank selection signal, to transfer write data to the corresponding memory banks in a write operation, and to output read data from the corresponding memory bank in a read operation;
   a latch unit configured to latch the bank address and the row address when the active command is activated after the test mode is set;
   a fail flag generation unit configured to compare read data transferred from the input/output circuits corresponding to the activated bank selection signals when the test mode is set, and to generate a fail flag based on the comparison result; and
   a nonvolatile memory configured to store the row address latched in the latch unit in a location designated by the bank address latched in the latch unit when the fail flag is activated.

9. The memory device of claim 8, wherein the bank selection unit is configured to activate one bank selection signal in response to the bank address in a normal operation.

10. The memory device of claim 9, wherein the bank selection unit is configured to activate one bank selection signal in response to all bits of the bank address in the normal operation, and to activate two or more bank selection signals in response to a partial bit of the bank address when the test mode is set.

11. The memory device of claim 8, wherein the bank active control unit is configured to activate a bank activation signal corresponding to an activated bank selection signal of the bank selection signals when an active command is activated, and to deactivate the activated bank activation signal when a precharge command is activated.

12. The memory device of claim 8, further comprising:
a plurality of data input/output pads; and
a data bus configured to transfer data input and output through the plurality of data input/output pads.

13. The memory device of claim 12, wherein the plurality of data input/output circuits are configured to transfer data received from the data bus to corresponding memory banks in a write operation, and to transfer data output from the corresponding memory banks to the data bus in a read operation, in a normal operation, and
wherein the plurality of data input/output circuits are configured to transfer the data received from the data bus to the corresponding memory banks in the write operation, and to transfer the data output from the corresponding memory banks to the fail flag generation unit in the read operation when the test mode is set.

14. A memory device comprising:
first to $N^{th}$ bank groups (N is an integer equal to or more than 2), each of which including two or more memory banks configured to allow row corresponding to row address to be active when bank activation signals corresponding to the memory banks are activated, and to perform read and write operations for column corresponding to column address when bank selection signals corresponding to the memory banks are activated;
a bank selection unit configured to generate the bank selection signals in response to a bank address, and to activate the plurality of bank selection signals when a test mode is set;
a bank active control unit configured to generate the bank activation signals in response to an active command and the bank selection signals;
a plurality of input/output circuits configured to be provided to the corresponding memory banks, to be activated in response to the corresponding bank selection signals, to transfer write data to the corresponding memory banks in a write operation, and to output read data from the corresponding memory banks in a read operation;
a latch unit configured to latch the row address when the active command is activated after the test mode is set;
first to $N^{th}$ fail flag generation units configured to correspond to the first to $N^{th}$ bank groups in a one-to-one manner, compare read data transferred from the input/output circuits corresponding to the memory banks in the corresponding bank groups when the test mode is set, and to generate first to $N^{th}$ fail flags based on the comparison result; and
a nonvolatile memory configured to store the row address latched in the latch unit in a location designated by an activated fail flag of the first to $N^{th}$ fail flags.

15. The memory device of claim 14, wherein the nonvolatile memory comprises first to $N^{th}$ storages including a plurality of memory sets for storing row address, and wherein the first to $N^{th}$ storages correspond to the first to $N^{th}$ fail flags in a one-to-one manner, and correspond to the first to $N^{th}$ bank groups.

16. The memory device of claim 15, wherein, when two or more fail flags of the first to $N^{th}$ fail flags are simultaneously activated, the row address latched in the latch unit are stored in storages corresponding to the activated fail flags.

17. The memory device of claim 15, wherein information stored in the first to $N^{th}$ storages are used for repair operations of corresponding bank groups.

18. The memory device of claim 14, wherein the bank selection unit is configured to activate one bank selection signal in response to the bank address in a normal operation.

* * * * *